US008101246B2

(12) United States Patent
Fayet et al.

(10) Patent No.: US 8,101,246 B2
(45) Date of Patent: Jan. 24, 2012

(54) DEVICE FOR CARRYING OUT A PLASMA-ASSISTED PROCESS

(75) Inventors: Pierre Fayet, Lausanne (CH); Bertrand Jaccoud, Siviriez (CH)

(73) Assignee: Tetral Laval Holdings & Finance S.A., Pully (CH)

( * ) Notice: Subject to any disclaimer, the term of this patent is extended or adjusted under 35 U.S.C. 154(b) by 0 days.

(21) Appl. No.: 12/691,408

(22) Filed: Jan. 21, 2010

(65) Prior Publication Data

US 2010/0116644 A1    May 13, 2010

Related U.S. Application Data

(60) Division of application No. 11/934,939, filed on Nov. 5, 2007, which is a continuation of application No. 10/529,531, filed as application No. PCT/CH03/00610 on Sep. 9, 2003, now abandoned.

(30) Foreign Application Priority Data

Oct. 3, 2002  (CH) ........................................ 1653/02

(51) Int. Cl.
*H05H 1/24*          (2006.01)
(52) U.S. Cl. ........................................ 427/579; 427/569
(58) Field of Classification Search .................. 427/579, 427/569
See application file for complete search history.

(56) References Cited

U.S. PATENT DOCUMENTS 4,863,756 A * 9/1989 Hartig et al. ................... 427/488
5,224,441 A * 7/1993 Felts et al. ..................... 118/718

FOREIGN PATENT DOCUMENTS

EP    0 299 754    1/1989

OTHER PUBLICATIONS

Fujimaki S. et al.; "New DLC coating method using magnetron plasma in an unbalanced magnetic field", Fifth International Symposium on Sputtering and Plama Processes (ISSP'99), Bd. 59, Nr. 2-3, Seiten 657-664, XP002231851, Vacuum, Nov.-Dec. 2000.
Biederman H., et al.: "Characterization of an unbalanced magnetron for composite film (metal/C:H) deposition" Vacuum, Apr. 1999, Elsevier, UK, Bd. 52, Nr. 4, Seiten 415-420, XP002231852 ISSN: 0042-207X Abbildunger 1, 4, 5B, 6B.

* cited by examiner

*Primary Examiner* — Kelly M Gambetta
(74) *Attorney, Agent, or Firm* — Rankin, Hill & Clark LLP

(57) ABSTRACT

A device for carrying out a plasma enhanced process includes, within a vacuum chamber, at least one magnetron electrode (32) constituting an unbalanced magnetron having a flat magnetron face (20) with peripheral and central magnetic poles of opposite polarities connected to a source (34) of alternating voltage. The device further includes a device for positioning a substrate (25), the substrate having a surface to be treated facing the magnetron face (20), and a gas supply device for supplying a process gas or process gas mixture to the space between the magnetron face (20) and the treated surface. The distance between the magnetron face (20) and the treated surface is adapted to the magnetic field created by the magnetron electrode (32) such that there is a visible plasma band running between darker tunnels formed by magnetic field lines extending between peripheral and central magnetic poles of the magnetron face (20) and the treated surface, the plasma band having a minimum width but having homogeneous brightness towards the treated surface.

10 Claims, 2 Drawing Sheets

DEVICE FOR CARRYING OUT A PLASMA-ASSISTED PROCESS

This application is a divisional of U.S. application Ser. No. 11/934,939, filed on Nov. 5, 2007 and currently pending, which is a continuation of U.S. application Ser. No. 10/529,531, filed on Apr. 19, 2005, the entire disclosure of which is incorporated by reference herein.

BACKGROUND OF THE INVENTION

1. Field of the Invention

The invention relates to a device for carrying out a plasma enhanced process, in particular a plasma enhanced chemical vapour deposition. The device serves e.g. for coating one side of a web of film or sheet material, in particular for coating a web of polymer film with silicon oxide in order to improve its barrier properties.

2. Description of Related Art

It is known e.g. from the publication EP-299754 (BOC) to deposit a thin film of silicon oxide on a substrate in a plasma enhanced chemical vapour deposition process. According to this publication a vacuum chamber is provided in which the electrically isolated substrate is positioned to face a magnetron being powered with an alternating voltage. A stream of a process gas mixture consisting of an organosilicon compound, oxygen and an inert gas (e.g. argon or helium) is flown into the space between the face of the magnetron and the substrate and the plasma derived from the process gas mixture is maintained at a pressure of e.g. 6 Pa.

The magnetron described in the publication EP-0299754 is a flat magnetron of a balanced or unbalanced type. The degree of unbalance of a flat magnetron depends on the strength ratio of the magnetic pole or poles positioned on either side of the track running around the magnetron face, i.e. on the ratio between the number of magnetic field lines extending from north to south poles across the track to the number of field lines not doing so. The unbalanced magnetron is known to not fully confine electrons and ions of the plasma such that there is a limited amount of electron and ion bombardment of the substrate which is said to improve the deposition quality. The magnetron face of the unbalanced magnetron according to EP-0299754 comprises peripheral north poles and a central core of soft iron, resulting in an only small portion of the field lines extending from the north poles to the core (highly unbalanced magnetron).

Publication EP-0605534 (BOC) describes a similar plasma enhanced chemical vapour deposition process wherein the substrate is a web. The web is carried by a rotating drum which constitutes the powered electrode and is negatively biased. Facing the web carried by the drum there is an electrically grounded and possibly cooled shield the back side of which is faced by at least one pair of opposing magnetic poles, preferably a series of alternating magnetic poles. Aided by the magnetic field the plasma is confined between the drum and the shield. The advantage of the arrangement is seen in the decoupling of the electric and the magnetic field, which is said to lead to an extension of the plasma throughout the plasma volume (between drum and shield). The distance between drum and shield is described as having to be within the range of 1 to 30 cm.

SUMMARY OF THE INVENTION

The object of the invention is to improve the above named devices applicable for plasma enhanced processes, in particular for plasma enhanced chemical vapour deposition but also for e.g. plasma etching or plasma processes for changing the wettability or adhesion characteristics of a surface and belonging to the type being based on a magnetron. The improvement is to regard in particular process efficiency. For a deposition process deposition rate and deposition quality are to be improved.

The device according to the invention comprises a vacuum chamber and within the chamber at least one magnetron electrode comprising an unbalanced magnetic pole arrangement and means for positioning a substrate with a surface to be treated facing the magnetron electrode and serving as counter electrode. Either electrode is powered with an alternating voltage. Advantageously the magnetron electrode is powered and the substrate or the positioning means carrying the substrate is electrically grounded, electrically floating or negatively biased. The distance between the magnetron face and the surface of the substrate to be treated is adapted to the characteristics of the magnetic field created by the permanent magnet poles of the magnetron face, being defined mainly by the magnetic strength of the poles, by the degree of unbalance of the pole arrangement and by the width of the track between the magnetic poles.

Experiments with a plasma enhanced chemical vapour deposition process in an otherwise unchanged system (same magnetic field and same electric field) show that the deposition rate is dependent on the distance between the magnetron face and the substrate in such a way that an optimum regarding deposition rate and deposition quality is found when the surface to be coated is positioned just outside the tunnels formed by the magnetic field lines extending across the track on the magnetron face, i.e. when the distance between magnetron face and surface to be coated is only slightly larger than the extension (height) of the tunnels from the magnetron face. Preferably the distance between the surface to be coated and the magnetron face is by 2 to 20% larger than the tunnel height. Within this range, the surface to be coated is positioned in an area where the electron density is higher than in the tunnels but where a considerable portion of the magnetic field lines are still shaped by the tunnels, i.e. have a component parallel to the magnetron face.

Visual observation of a plasma maintained between an unbalanced magnetron with a flat rectangular face (observation parallel to the longer side of the magnetron face) and a surface to be treated and arranged substantially parallel to the magnetron face shows the named tunnels as quite clearly distinguishable darker areas within the plasma, which outside of the tunnels appears brighter. The above discussed setting of the distance between the magnetron face and the substrate to be dependent on the characteristics of the magnetic field can easily be based on such observation. The surface to be coated is positioned beyond the tunnels such that there is a bright plasma band extending between the tunnels and the surface to be treated, the band having a minimum width but having towards the surface to be coated a homogeneous brightness, i.e. the same brightness at positions above tunnels as at a position above the gap between tunnels.

BRIEF DESCRIPTION OF THE DRAWINGS

The principle of the device according to the invention as well as a preferred embodiment thereof are described in further detail in connection with the following figures, wherein:

top view of the magnetron face; FIG. 3: section perpendicular to the magnetron face, section line III-III in FIG. 2);

DETAILED DESCRIPTION OF THE INVENTION

Figure 1:
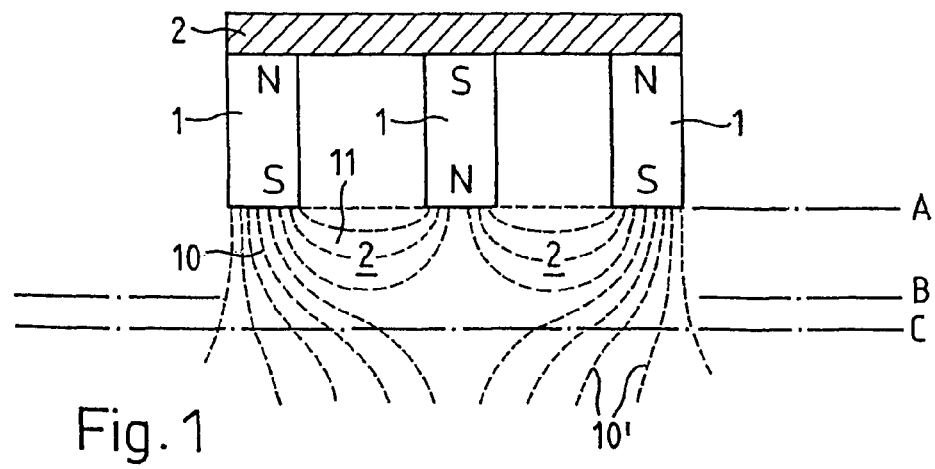
FIG. 1 shows the principle of the device according to the invention.

FIG. 1 shows the magnetic field of a flat unbalanced magnetron in a section perpendicular to the magnetron face. Three permanent magnets 1 are arranged alternately, their poles on one side being connected by a piece 2 of a magnetizeable material, e.g. soft iron. The poles opposite the connecting piece 2 form the flat magnetron face (plane A) which comprises e.g. a central north pole and peripheral south poles, the north pole e.g. having the same strength as each one of the south poles. There are further provided means (not shown) for establishing an alternating electric field with electric field lines extending substantially perpendicular to the magnetron face, e.g. an electrode piece extending over the magnetron face and being powered by an alternating voltage (see FIG. 3).

The pole arrangement of the face of an unbalanced magnetron creates a first portion of magnetic field lines 10 extending from north pole to either one of the south poles such forming the tunnel 11 on the base of which electrons and ions are confined and another portion of field lines 10' originating elsewhere and ending in the south poles. The extension of the tunnels 11 (plane B) above the magnetron face is dependent on the magnetic strength of the poles, on the distance between the poles (width of track) and on the ratio of the strengths of central and peripheral poles (degree of unbalance of the magnetron).

According to the invention, the substrate surface to be treated (plane C) is positioned such that it is definitely outside of the tunnels 11 but as near as possible to the magnetron face A. The distance between planes A and C is preferably at least 2% larger than the distance between planes A and B, even more preferably between 2 and 20% larger than the distance between planes A and B.

Figure 2:
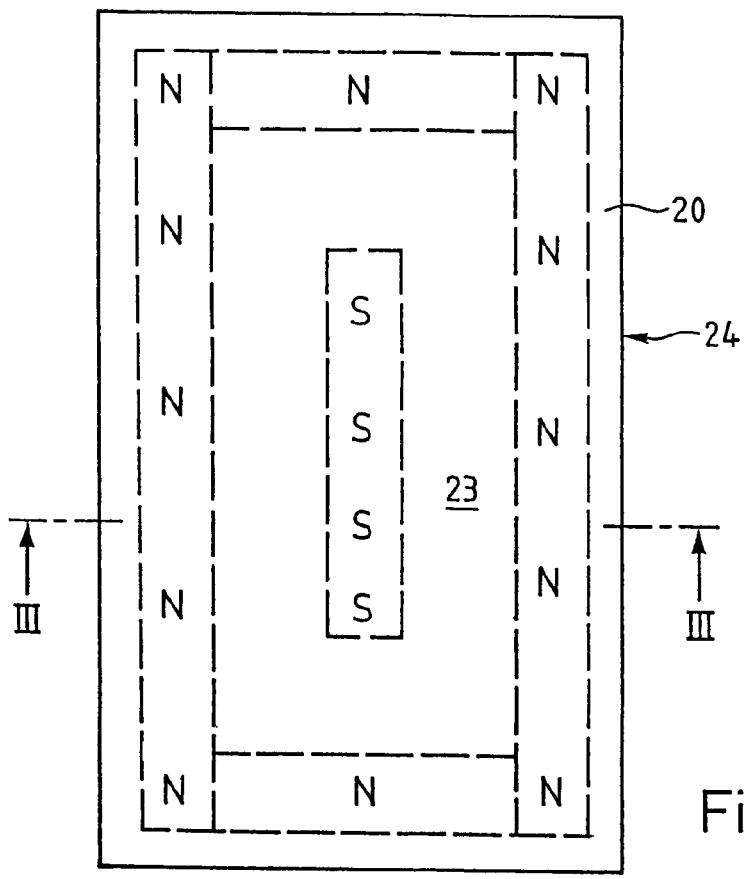
FIGS. 2 and 3 show an exemplified magnetron electrode applicable in the device according to the invention (FIG. 2.
Figure 3:
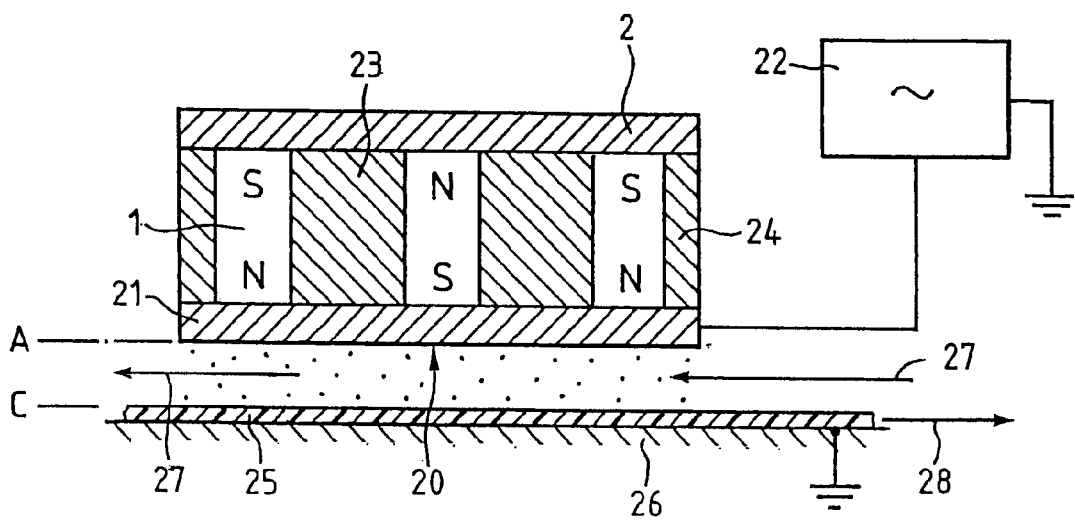

FIGS. 2 and 3 show an exemplified embodiment of a magnetron electrode applicable for the inventive device. The magnetron electrode has a flat, rectangular face and is again of the unbalanced type. FIG. 2 shows the face of the magnetron, FIG. 3 shows a section perpendicular to the magnetron face (section line III-III of FIG. 2) and a substrate positioned facing the magnetron electrode e.g. for being coated.

The magnetron electrode comprises alternately arranged permanent magnets 1. A peripheral arrangement of north poles and a central line of south poles (or five bar shaped permanent magnets with opposite poles on opposite longitudinal sides) constitute the magnetron face 20 which is covered by a powered electrode piece 21 being made of a non magnetizeable material, e.g. of aluminium, stainless steel or copper and being connected to a source 22 of a high frequency alternating voltage. The same material is preferably used for filling the gaps 23 between the permanent magnets 1. The magnetic poles facing away from the magnetron face are connected by a connecting piece 2 of a mangetizeable material e.g. of soft iron. A peripheral wall 24 surrounding the permanent magnets is preferably made of a magnetizeable material also.

The substrate to be treated is e.g. a web 25 being supported by a grounded support 26, along which the web is moved continuously (arrow 28). The support 26 may also be electrically floating or negatively biased. The plasma is confined between the magnetron face and the substrate, optimum deposition being achieved with a distance A-C fulfilling the above described conditions. The process gas mixture is flown through the plasma space, e.g. in the manner as illustrated by arrows 27.

Figure 4:
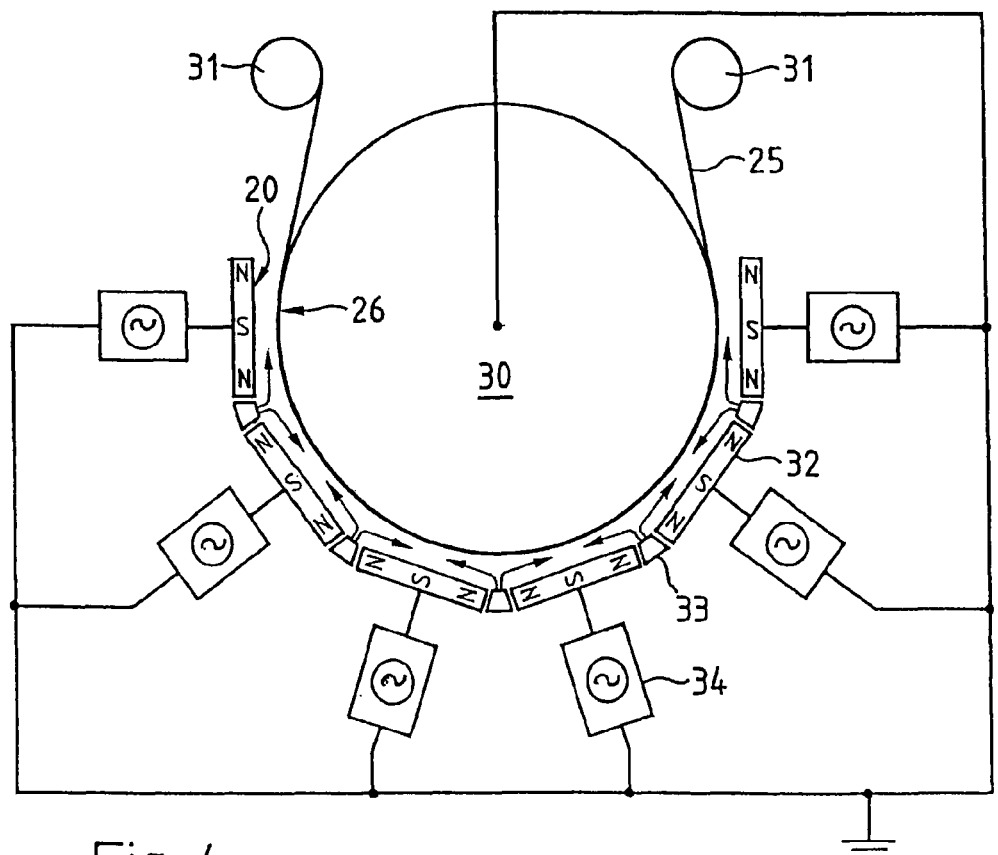
FIG. 4 shows a preferred embodiment of the device according to the invention, serving for coating a web of flexible material, e.g. for coating a polymer film material with silicon oxide for improving its barrier properties.

FIG. 4 shows an exemplified embodiment of the inventive device, which embodiment serves for coating or otherwise treating a web of a flexible substrate material. The substrate 25 is transported by a rotating drum 30 constituting the support 26 for the substrate 25. The web is unwound from a first supply roll 31 and wound onto a second supply roll 31. Around part of the circumference of the drum 30 and at the above described distance from it, a plurality of magnetron electrodes 32 as illustrated by FIGS. 2 and 3 is arranged. The magnetron faces face towards the drum 30 and their length is arranged parallel to the drum axis. Gas supply lines 33 (e.g. tubes comprising a line of gas supply apertures) for supplying the process gas mixture are arranged extending parallel to the drum axis between the magnetron electrodes 32. The arrangement of drum 30, supply rolls 31, magnetron electrodes 32 and gas supply lines 33 is arranged in a not shown vacuum chamber equipped with means for removing gas from the chamber and keeping the inside of the chamber at a constant reduced pressure. Each magnetron electrode 32 is advantageously electrically powered by its own power supply 34. The process gas flows mainly from the supply lines 33 towards the drum faces from where it is evacuated.

Experiments show that using an arrangement with a plurality of individually powered magnetron electrodes 32 not only makes operation more reliable (operation with one defect magnetron electrode can be carried on with a correspondingly reduced web speed) but also improves efficiency. While an arrangement as shown in FIG. 4 produces a visibly homogeneous plasma along the web surface to be coated and high operational stability, a similar arrangement with a singly powered magnetron-like arrangement as e.g. shown in the publication EP-0605534 spanning a similar sector of the drum circumference shows a gradient in plasma intensity along the space between drum and shield with an increasing intensity from web entry to web exit and with a very high plasma intensity in the area of the web exit, constituting a source of instability.

Example 1

A device according to FIG. 4 with four magnetron electrodes according to FIGS. 2 and 3, each magnetron face being 600 mm long and 150 mm wide and each magnetron face comprising a central permanent magnet of a magnetic induction of ca. 100 Gauss ($10^{-2}$ Tesla) and peripheral permanent magnets of ca. 200 Gauss being arranged around the central magnet with a distance between the poles of ca. 50 mm is used for coating a polymer film with silicon oxide using a plasma derived from a process gas mixture comprising an organosilicon compound and oxygen. The magnetron faces are positioned at a distance from the drum circumferential surface of ca. 60 mm (visibly such that there is a narrow bright band of plasma running beyond the tunnels along the substrate showing towards the substrate a regular intensity not being dependent on the tunnel positions). The magnetrons are powered with a total of 14 kW per $m^2$ of magnetron face at a frequency of 40 kHz. The deposition rate such achieved is ca. 3 nm per second with a high barrier quality and high reliability. Alterations of the distance between magnetron faces and drum circumferential surface in either direction result in a relevant reduction of the deposition rate.

Using a similar set up and similar operation parameters except for the permanent magnets having a four times higher magnetic induction results in a deposition rate maximum at a distance between magnetron faces and drum circumferential surface which is lager than 60 mm, preferably between 80 and 100 mm and in a deposition rate clearly above the deposition rate achieved with the weaker magnets as described above.

What is claimed is:

1. A method of treating a surface of a substrate in a plasma enhanced process, the substrate having a surface to be treated and a further surface not to be treated and located opposite the surface to be treated, the method comprising the steps of:

providing a space between a flat face of a magnetron electrode on a first side and a surface of a substrate support facing the electrode on a second, opposite side, wherein the magnetron electrode is of an unbalanced type and comprises a flat magnetron face with peripheral and central magnetic poles of opposite polarities, and an electrode piece being powered with a high frequency alternating voltage, and wherein the substrate support is electrically grounded, electrically floating or negatively biased, positioning the substrate in said space with the further surface lying against the substrate support and the surface to be treated facing towards the face of the magnetron electrode, evacuating said space and feeding a process gas or process gas mixture into said space, keeping it at a reduced pressure and therewith igniting and sustaining a plasma in said space, wherein a magnetic field generated by the magnetron electrode causes darker tunnels to extend along the magnetron face wherein the tunnels have a height perpendicular to the face of the magnetron electrode, adapting the distance between the surface to be treated and the face of the magnetron electrode to the magnetic field such that there is a visible plasma band running between darker tunnels and the surface to be treated, and such that said surface, for the duration of treatment, is situated outside of the darker tunnels in the plasma band, and wherein a distance between the surface being treated and the face of the magnetron electrode is at least 2% larger than a visible height of the darker tunnels.

2. The method of claim 1, wherein the distance between the surface to be treated and the face of the magnetron electrode is adapted such that there is a visibly homogeneous light plasma band between the region of the tunnels and the surface to be treated.

3. The method of claim 1, wherein the distance between the surface to be treated and the face of the magnetron electrode is at least 2% and at the most 20% larger than the height of the darker tunnels.

4. The method of claim 1, wherein the substrate support together with the substrate positioned against the support is moved past the magnetron electrode.

5. The method of claim 1, wherein a magnetic strength of the central magnetic pole of the magnetron face is about half of a magnetic strength of the peripheral pole.

6. The method according to claim 1, wherein the substrate support is a rotating drum and wherein a plurality of magnetron electrodes having rectangular faces being arranged with their length parallel to the rotation axis of the drum are arranged around part of a circumference of the drum.

7. The method of claim 1, wherein the process gas or process gas mixture is fed to said space from gas supply lines extending parallel to a drum axis between the magnetron faces.

8. The method of claim 1, further comprising the step of connecting each of the plurality of magnetrons to a separate power supply.

9. The method of claim 1, wherein by using a process gas comprising an organosilicon compound and oxygen a silicon oxide is deposited on the substrate.

10. The method of claim 1, wherein the substrate is a web of polymer film material being coated for improving its barrier properties.

\* \* \* \* \*